US009406542B2

(12) United States Patent
Miyanari

(10) Patent No.: US 9,406,542 B2
(45) Date of Patent: Aug. 2, 2016

(54) RETENTION DEVICE AND RETENTION METHOD

(75) Inventor: Atsushi Miyanari, Kawasaki (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 399 days.

(21) Appl. No.: 14/125,537

(22) PCT Filed: May 25, 2012

(86) PCT No.: PCT/JP2012/063561
§ 371 (c)(1),
(2), (4) Date: Dec. 11, 2013

(87) PCT Pub. No.: WO2012/172957
PCT Pub. Date: Dec. 20, 2012

(65) Prior Publication Data
US 2014/0109941 A1 Apr. 24, 2014

(30) Foreign Application Priority Data

Jun. 15, 2011 (JP) .................................. 2011-133261

(51) Int. Cl.
*H01L 21/683* (2006.01)
*H01L 21/67* (2006.01)
*H01L 21/02* (2006.01)

(52) U.S. Cl.
CPC ...... *H01L 21/6838* (2013.01); *H01L 21/67132* (2013.01); *H01L 21/02057* (2013.01); *Y10T 279/11* (2015.01)

(58) Field of Classification Search
CPC .................................................... B25B 11/002
See application file for complete search history.

(56) References Cited

U.S. PATENT DOCUMENTS

| 6,302,387 | B1* | 10/2001 | Schmalz | ............ | B25B 11/005 269/20 |
| 6,764,258 | B1* | 7/2004 | Akre | .................. | B23Q 1/5468 269/21 |
| 6,817,601 | B2* | 11/2004 | Schmalz | ............ | B25B 11/005 269/21 |
| 2002/0074703 | A1* | 6/2002 | Schmalz | ............ | B23Q 1/037 269/21 |
| 2003/0102682 | A1 | 6/2003 | Kurokawa | | |
| 2010/0037916 | A1 | 2/2010 | Iwata et al. | | |

(Continued)

FOREIGN PATENT DOCUMENTS

| JP | 08-206570 | 8/1996 |
| JP | 11-186133 | 7/1999 |

(Continued)

OTHER PUBLICATIONS

Office Action in corresponding Japanese Patent Application No. 2011-133261, mailed Jan. 12, 2016.

(Continued)

*Primary Examiner* — Lee D Wilson
(74) *Attorney, Agent, or Firm* — Knobbe Martens Olson & Bear LLP

(57) ABSTRACT

A holding device including a first sucking section for sucking a wafer (substrate) from a side on which a dicing tape (supporting film) is adhered; a structure that supports a dicing frame (frame part) and covers a first region which (i) is on a surface of the dicing tape to which surface the wafer is not adhered and (ii) is between the wafer and the dicing frame; and a second sucking section for sealing a boundary between the structure and at least one of the dicing frame and the first region.

17 Claims, 8 Drawing Sheets

(56) References Cited

U.S. PATENT DOCUMENTS

| | | | |
|---|---|---|---|
| 2010/0130105 A1* | 5/2010 | Lee | B24B 37/04 451/41 |
| 2010/0243168 A1 | 9/2010 | Nakano et al. | |
| 2011/0059620 A1 | 3/2011 | Kitahara | |

FOREIGN PATENT DOCUMENTS

| | | |
|---|---|---|
| JP | 2008-016485 | 1/2008 |
| JP | 2008-140908 | 6/2008 |
| JP | 2009-095953 | 5/2009 |
| JP | 2010-098093 | 4/2010 |
| JP | 2010-153410 | 7/2010 |
| JP | 2010-239026 | 10/2010 |
| JP | 2012-084792 A | 4/2012 |
| KR | 2011-0026390 | 3/2011 |

OTHER PUBLICATIONS

Office Action in Korean Patent Application No. 10-2014-7000635, mailed Apr. 15, 2015.
First Office Action in Taiwanese Patent Application No. 101121097, mailed Jan. 25, 2016.
International Search Report issued in PCT/JP2012/063561 on Jun. 26, 2012.

* cited by examiner

RETENTION DEVICE AND RETENTION METHOD

This application is the U.S. National Phase under 35 U.S.C. §371 of International Application No. PCT/JP2012/063561, filed May 25, 2012, designating the U.S., and published in Japanese as WO 2012/172957 on Dec. 20, 2012, which claims priority to Japanese Patent Application No. 2011-133261, filed Jun. 15, 2011, the entire content of which is incorporated herein by reference.

TECHNICAL FIELD

The present invention relates to a holding device and a method for holding a substrate. Specifically, the present invention relates to a holding device for and a method for holding a substrate which is adhered to a center part of a supporting film that has a frame part at its outer edge.

BACKGROUND ART

In recent years, reductions in thickness, in size, and in weight are demanded for electronic apparatuses such as an IC card or a mobile phone. In order to meet the demands, a thin semiconductor chip needs to be incorporated in such electronic apparatuses. Under the circumstances, although a thickness (film thickness) of a semiconductor wafer, which is a base of a semiconductor chip, is currently 125 μm to 150 μm, it is said that the thickness needs to be 25 μm to 50 μm for a next-generation chip. Therefore, in order to obtain a semiconductor wafer having such a film thickness, it is necessary to carry out a process of reducing a thickness of the semiconductor wafer.

Such a process of reducing the thickness of the semiconductor wafer is carried out as follows: First, a supporting plate for protecting the semiconductor wafer is attached to the semiconductor wafer via (i) a tape which has adhesive layers on its both sides or (ii) an adhesive agent so that the supporting plate covers a circuit formation surface of the semiconductor wafer. Next, the semiconductor wafer is turned upside down and a thickness of the semiconductor wafer is reduced by grinding a backside surface of the semiconductor wafer with the use of a grinder. Subsequently, the backside surface of the semiconductor wafer whose thickness has been thus reduced is fixed to a dicing tape which is held by a dicing frame. Further, the supporting plate covering the circuit formation surface of the semiconductor wafer in this state is removed, and then the semiconductor wafer is divided into chips with the use of a dicing device.

In a case where the process of reducing the thickness is thus carried out, the adhesive agent and the like are left on the circuit formation surface of the semiconductor wafer after the supporting plate is removed. Therefore, it is necessary to remove the attached adhesive agent and the like so that the circuit formation surface of the semiconductor wafer becomes a clean surface. That is, it is necessary to carry out a cleaning process on the surface of the semiconductor wafer (i) after the supporting plate covering the circuit formation surface of the semiconductor wafer is removed while the semiconductor wafer is being fixed to the dicing tape and (ii) before the semiconductor wafer is divided into chips with the use of the dicing device.

When the cleaning process is carried out or the supporting plate is removed before the cleaning process, the semiconductor wafer may be placed on and held by a holding pedestal or the like.

Patent Literature 1 discloses a conventional technique to hold a semiconductor wafer. FIG. 12 is a schematic view for schematically illustrating a processing device 90 for processing a wafer in Patent Literature 1. (a) of FIG. 12 is a lateral cross-sectional view of the processing device 90, (b) of FIG. 12 is a top view of the processing device 90, and (c) of FIG. 12 is a perspective view of the processing device 90.

As illustrated in (a) of FIG. 12, the processing device 90 holds a wafer 2 which is adhered to a center part of a dicing tape 3 that has a dicing frame 4 at its outer edge. Specifically, the processing device 90 holds a process target 1 by sucking the wafer 2 with a chuck table 91 and sucking the dicing frame 4 with a sucking pad 92. In this case, a guide rod 95 movably supports the sucking pad 92 in a radial direction of the chuck table 91, and therefore the processing device 90 can deal with various sizes of dicing frames.

CITATION LIST

Patent Literature

[Patent Literature 1]
Japanese Patent Application Publication Tokukai No. 2009-95953 A (Publication date: May 7, 2009)

SUMMARY OF INVENTION

Technical Problem

However, in a case where a process such as a cleaning of a substrate in an atmosphere of solvent while the substrate (wafer 2), which is adhered to a center part of a supporting film (dicing tape 3) that has a frame part (dicing frame 4) at its outer edge, is held by a conventional holding device as illustrated in FIG. 12, there is a problem that the supporting film is swelled by the atmosphere of solvent and accordingly sags. That is, the supporting film, which does not sag as illustrated in FIG. 1, is changed to the supporting film which sags as illustrated in FIG. 2. This interferes with vacuum suction and holding or carrying of the substrate.

The present invention is accomplished in view of the problem, and its main purpose is to provide a holding technique that (i) protects a supporting film from an atmosphere of solvent or the like while a substrate is held which is adhered to a center part of the supporting film that has a frame part at its outer edge and thereby (ii) inhibits the supporting film from sagging.

Solution to Problem

A holding device of the present invention is a holding device for holding a substrate which is adhered to a center part of a supporting film having a frame part at its outer edge, the holding device including: substrate sucking means for sucking the substrate from a side on which the supporting film is adhered; a structure that supports the frame part and covers a region which (i) is on a surface of the supporting film to which surface the substrate is not adhered and (ii) is between the substrate and the frame part; and sealing means for sealing a boundary between the structure and at least one of the frame part and the first region.

A holding method of the present invention is a method for holding a substrate which is adhered to a center part of a supporting film having a frame part at its outer edge, the method including the steps of: sucking the substrate from a side on which the supporting film is adhered; covering, with a structure, a region which (i) is on a surface of the supporting film to which surface the substrate is not adhered and (ii) is between the substrate and the frame part; and sealing a boundary between the structure and at least one of the frame part and the first region.

Advantageous Effects of Invention

According to the present invention, the supporting film is protected from an atmosphere of solvent or the like while the substrate is held which is adhered to the center part of the supporting film that has the frame part at its outer edge, and this makes it possible to inhibit the supporting film from sagging.

DESCRIPTION OF EMBODIMENTS

[Embodiment 1]

The following description will discuss an embodiment (Embodiment 1) of the present invention with reference to drawings.

(Process Target)

Figure 1:
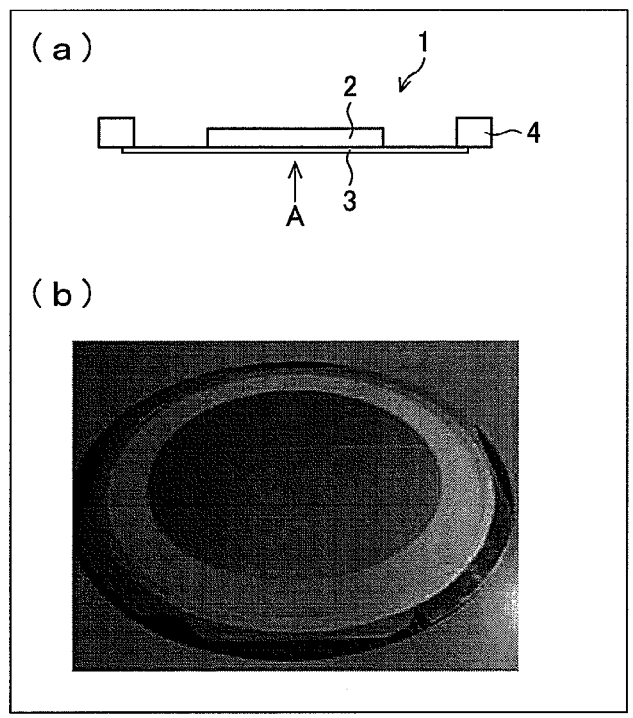
FIG. 1 is a view schematically illustrating a configuration of a process target including a supporting film which is not sagging. (a) is a lateral view of the process target, and (b) is a view of the process target observed in an A-direction in (a).

FIG. 1 is a view schematically illustrating a configuration of a process target 1 which is to be held in the present embodiment. (a) of FIG. 1 is a lateral view of the process target 1, and (b) of FIG. 1 is a view of the process target 1 observed in an A-direction in (a) of FIG. 1.

As illustrated in FIG. 1, the process target 1 includes a wafer (substrate) 2 which is adhered to a center part of a dicing tape 3 (supporting film) that has a dicing frame 4 (frame part) at its outer edge. The wafer 2 is a substrate on which a circuit (element) is formed, and can be made of a conventionally known material such as a semiconductor.

The dicing tape 3 is adhered to one surface of the wafer 2 so as to strengthen the wafer 2. The dicing tape 3 can be a dicing tape having a configuration in which, for example, an adhesive layer is formed on a base film. The base film can be, for example, a resin film made of a material such as PVC (polyvinyl chloride), polyolefin, or polypropylene.

The dicing tape 3 is larger than an outer diameter of the wafer 2, and therefore, a peripheral part of the dicing tape 3, to which the wafer 2 is adhered, is exposed. The dicing frame 4 for supporting the dicing tape 3 is provided in a further periphery of the exposed surface of the dicing tape 3. As illustrated in FIG. 1, the wafer 2 and the dicing frame 4 are attached to an identical surface of the dicing tape 3.

The present embodiment is suitably applicable to a process of cleaning the wafer 2 after a supporting plate (not illustrated) is removed, which has been temporarily held in manufacturing the wafer.

That is, during manufacturing the wafer 2, an unintended substance may be attached to a surface of the wafer 2 when the wafer 2 is manufactured, and it is therefore necessary to remove the attached substance so as to clean the surface of the wafer 2. In particular, when the supporting plate, which has been adhered to the wafer 2 via an adhesive agent, is removed, the adhesive agent and the like are left on the surface of the wafer 2. Therefore, it is necessary to clean the surface of the wafer 2 while fixing the wafer 2 to the dicing tape 3 before the wafer 2 is divided into chips by dicing.

Such a cleaning can be carried out, for example, by discharging a cleaning solution, which is an organic solvent or an aqueous solvent, to the wafer 2 with the use of a two fluid nozzle or the like.

In this case, an atmosphere of solvent is formed around the process target 1 by the discharged cleaning solution. In a case where the process target 1 is held by the use of a conventional holding device, the dicing tape 3 may be swelled by the atmosphere of solvent and the dicing tape 3 may therefore sag.

The present invention can of course successfully inhibit the dicing tape 3 from sagging due to the atmosphere of solvent in processing the wafer 2 in various cases, as well as inhibiting the dicing tape 3 from sagging in cleaning.

Figure 2:
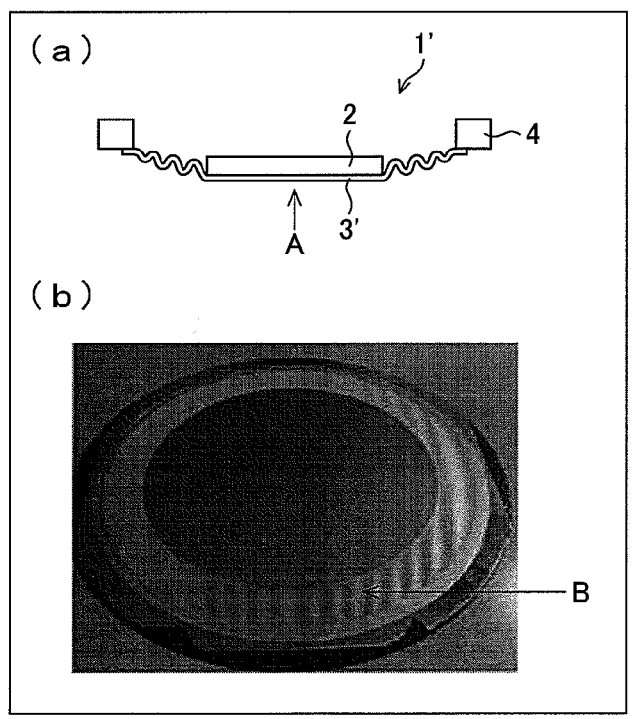
FIG. 2 is a view schematically illustrating a configuration of a process target including a supporting film which is sagging. (a) is a lateral view of the process target, and (b) is a view of the process target observed in an A-direction in (a).

FIG. 2 is a view schematically illustrating a configuration of a process target 1' having a dicing tape 3' which is swelled. (a) is a lateral view of the process target 1', and (b) is a view of the process target 1' observed in an A-direction in (a) of FIG. 2.

According to the process target 1' illustrated in FIG. 2, a part of the dicing tape 3', which part is between the wafer 2 and the dicing frame 4, is sagging (i.e., a part indicated by "B" in (b) of FIG. 2). Such a process target 1' may cause a problem as follows.

Figure 3:
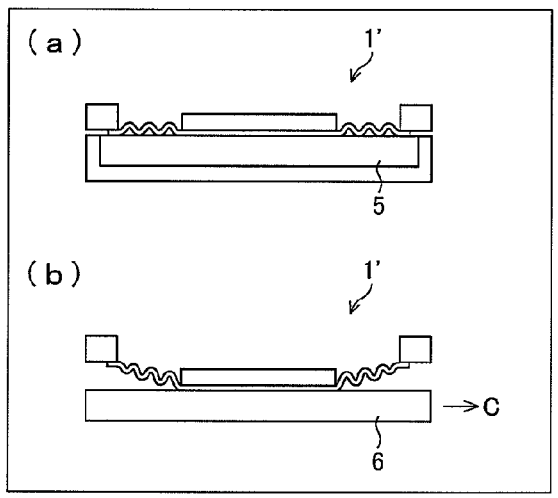
FIG. 3 is a schematic view for explaining a problem caused in a process target when a supporting film is sagging. (a) illustrates a state in which the process target is vacuum-sucked and held, and (b) illustrates a state in which the process target is being carried.

That is, as illustrated in (a) of FIG. 3, when the process target 1' is intended to be held by a porous stage (sucking section) 5, it is difficult to successfully suck and hold the sagging part. In a case where the process target 1' is carried with the use of a carrying robot arm 6 that holds a bottom of the substrate (see (b) of FIG. 3) and the process target 1' is to be contained in a cassette, the process target 1' may be dragged due to the sagging when the carrying robot arm 6 is returned to a predetermined location after the process target 1' is placed in the cassette.

According to a holding device 10 of the present embodiment, it is possible to prevent such a problem and to suitably hold a process target.

(Solvent)

A solvent that forms an atmosphere of solvent is not limited to a particular one. Such a solvent can be, for example, a cleaning solution for cleaning the wafer 2. Such a cleaning solution is not limited in particular, provided that the cleaning solution contains a nonaqueous solvent, and can be, for example, a known cleaning solution such as a terpene solvent such as p-menthane. Examples of the known cleaning solution encompass linear hydrocarbon such as hexane, heptane, octane, nonane, methyloctane, decane, undecane, dodecane, or tridecane, and $C_3$ to $C_{15}$ branched hydrocarbon; and cyclic hydrocarbon (terpenoid) such as (i) monoterpenoid such as geraniol, nerol, linalool, citral, citronellol, p-menthane, o-menthane, m-menthane, diphenylmenthane, menthol, isomenthol, neomenthol, limonene, α-terpinene, β-terpinene, γ-terpinene, α-terpineol, β-terpineol, γ-terpineol, terpinene-1-ol, terpinene-4-ol, 1,4-terpin, 1,8-terpin, carvone, ionone, thujone, camphor, bornane, borneol, norbornane, pinane, α-pinene, β-pinene, thujane, α-thujone, β-thujone, carane, camphor, longifolene, 1,4-cineol, or 1,8-cineol or (ii) diterpenoid such as abietane or abietic acid.

Even in a case where no solvent is used to process the process target 1, an atmosphere of solvent may be formed by an adjacent processing device or a cleaning device. Even in such a case, the holding device 10 can be suitably used.

(Holding Device)

Figure 6:
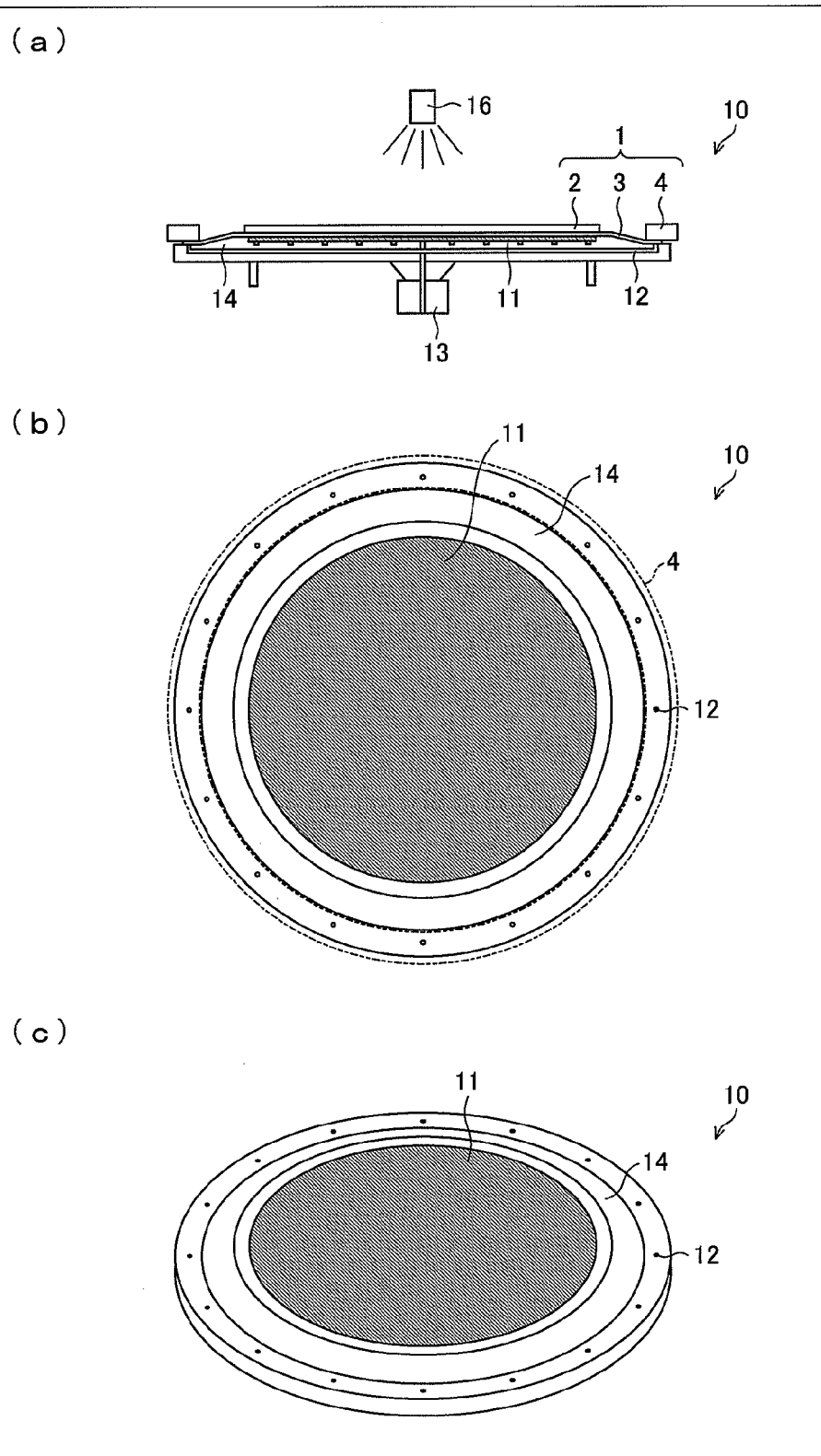
FIG. 6 is a view schematically illustrating a configuration of a holding device in accordance with an embodiment of the present invention. (a) is a lateral cross-sectional view of the holding device, (b) is a top view of the holding device, and (c) is a perspective view of the holding device.

FIG. 6 is a view schematically illustrating a configuration of the holding device 10 in accordance with an embodiment of the present invention. (a) of FIG. 6 is a lateral cross-sectional view of the holding device 10, (b) of FIG. 6 is a top view of the holding device 10, and (c) of FIG. 6 is a perspective view of the holding device 10.

As illustrated in FIG. 6, the holding device 10 includes a first sucking section (first sucking means) 11, a second sucking section (second sucking means) 12, a rotating section (rotating means) 13, a structure 14, and a solvent adding section (solvent adding means) 16. The first sucking section 11 and the second sucking section 12 are provided on the structure 14.

The first sucking section 11 sucks the wafer 2 from a side on which the dicing tape 3 is provided. As a sucking mechanism, a conventionally known sucking mechanism can be employed. For example, a suction hole (not illustrated) for sucking gas on a suction surface can be provided. The suction hole is connected with decompressing means such as a vacuum pump. When the sucking means is operated while the wafer 2 is placed on the sucking means, a boundary between the wafer 2 and the suction surface is decompressed so that the wafer 2 can be held by suction. The suction hole can be provided by forming a hole in a plate member at a predetermined location. For example, the suction hole can be a through hole that passes through a plate. Alternatively, the suction hole can be formed with the use of a porous material. Examples of the porous material encompass polypropylene, carbon, aluminum, and ceramic. With the suction hole, the wafer 2 is fixed to the structure 14. Note that a surface of the first sucking section 11 on which surface the wafer 2 is to be placed is not limited in particular. However, it is preferable that the surface has a shape similar to that of the wafer 2 and can have, for example, a circular shape.

The second sucking section 12 sucks the dicing frame 4 so that a boundary between the structure 14 and the dicing frame 4 is sealed up. The second sucking section 12 can have a sucking mechanism identical with that of the first sucking section 11. As illustrated in (b) of FIG. 6, it is preferable that the second sucking section 12 is provided along a region in which the dicing frame 4 is placed.

The structure 14 supports (i) the wafer 2 via the first sucking section 11 and (ii) the dicing frame 4 via the second sucking section 12. The structure 14 covers a first region which is (i) on a lower surface (i.e., a surface of a side on which the wafer 2 is not adhered) of the dicing tape 3 and (ii) between the wafer 2 and the dicing frame 4 (see FIG. 6). In this case, the boundary between the structure 14 and the dicing frame 4 is sealed with the second sucking section 12, and this makes it possible to prevent an atmosphere of solvent from reaching the first region.

As such, the holding device 10 is a holding device for holding the wafer 2 which is adhered to the center part of the dicing tape 3 that has the dicing frame 4 at its outer edge. The holding device 10 includes (i) the first sucking section 11 for sucking the wafer 2 from the side on which the dicing tape 3 is adhered, (ii) the structure 14 that supports the dicing frame 4 and covers the first region which (a) is on the surface of the dicing tape 3 to which surface the wafer 2 is not adhered and (b) is between the wafer 2 and the dicing frame 4, and (iii) the second sucking section 12 for sealing the boundary between the structure 14 and the dicing frame 4. This prevents the atmosphere of solvent from reaching the first region, and it is therefore possible to inhibit the dicing tape 3 from sagging. Therefore, according to the holding device 10, it is possible to (i) prevent various problems caused by the sag of the dicing tape 3, and accordingly (ii) suitably hold the process target 1.

Note that the mechanism of the holding device 10 for sealing the boundary between the structure 14 and the dicing frame 4 is not limited to the second sucking section 12, provided that the holding device 10 includes such a mechanism. Instead of the second sucking section 12, the holding device 10 can have, for example, a sealing mechanism (sealing means) for pressing the dicing frame 4 to the structure 14 by physical force or magnetic force so as to seal the boundary between the structure 14 and the dicing frame 4.

In the present embodiment, the structure 14 is formed by integrating (i) a part in which the first sucking section 11 is provided and (ii) a part in which the second sucking section 12 is provided. Note, however, that the present embodiment is not limited to this. Therefore, the part in which the first sucking section 11 is provided and the part in which the second sucking section 12 is provided can be made up of separate members, provided that the structure 14 has a shape that covers the first region which is (i) on the lower surface of the dicing tape 3 and (ii) between the wafer 2 and the dicing frame 4.

The solvent adding section 16 is a mechanism for adding a solvent, which is used to process the process target 1 as above described, to the process target 1 held by the holding device 10. Because the holding device 10 includes such a mechanism, it is possible to suitably carry out a process such as a cleaning of the wafer 2 with the use of a solvent. The solvent adding section 16 has, for example, a discharging and supplying mechanism such as a nozzle. Alternatively, the solvent adding section 16 can have a two fluid nozzle for discharging a solvent and air together.

The method for cleaning the wafer 2 is not limited to a particular one, and a solvent can be discharged onto the wafer 2 from the solvent adding section 16. By thus discharging the solvent to the wafer 2, it is possible to flush and remove a residue on the wafer 2 (see (d) and (e) of FIG. 11).

The rotating section 13 is a rotating mechanism for rotating the wafer 2 in an in-plane direction of a substrate surface of the wafer 2 by rotating the structure 14 while the wafer 2 is being sucked by the first sucking section 11. By rotating the wafer 2 while adding the solvent from the solvent adding section 16 to the wafer 2, it is possible to suitably carry out a so-called spin cleaning. This allows the solvent to be widely spread by centrifugal force, and it is therefore possible to efficiently carry out the cleaning. In this case, the solvent can be discharged while the solvent adding section 16 is being swung (see (d) and (e) of FIG. 11). That is, in an aspect, the holding device 10 can be a substrate cleaning device. A rotating speed of the wafer 2 can be set as appropriate in accordance with usage or the like and can be, for example, 500 $min^{-1}$ or higher and 3000 $min^{-1}$ or lower.

Note that it is preferable that the structure 14 supports the dicing frame 4 such that the dicing frame 4 is located lower than the wafer 2 in a case where the wafer 2 is horizontally placed (see (a) of FIG. 6). According to the configuration, the dicing tape 3 is to be pulled downwards because the second sucking section 12 is sucking the dicing frame 4. This makes it possible to reduce influence derived from warpage of the wafer 2 and the dicing frame 4 and from wrinkles of the dicing tape 3.

In this case, as illustrated in (a) of FIG. 6, it is preferable that a surface of the structure 14, which surface faces the first region, includes a surface that inclines downwards with respect to a substrate surface of the wafer 2. The structure 14 is thus processed to have a tapered shape so that no sharp part is included in the surface that is in contact with the dicing tape 3, and it is therefore possible to avoid a breakage of the dicing tape 3.

(Modification Example of Second Sucking Section)

In the above description, the second sucking section 12 is configured to suck the dicing frame 4. Note, however, that the present embodiment is not limited to this, provided that the second sucking section 12 is configured to suck at least one of the dicing frame 4 and the dicing tape 3. Specifically, it is sufficient that the second sucking section 12 sucks at least one of (i) the dicing frame 4 and (ii) the first region, which is on the lower surface of the dicing tape 3 and is between the wafer 2 and the dicing frame 4, so that a boundary between the structure 14 and at least one of the dicing frame 4 and the first region is sealed.

Figure 7:
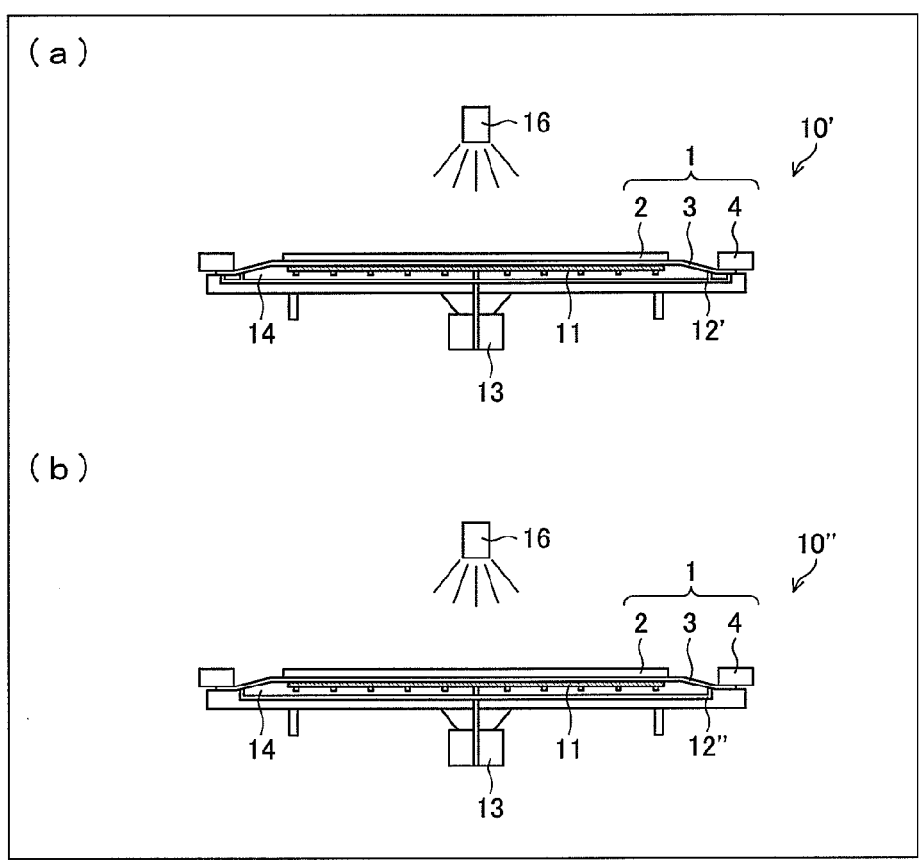
FIG. 7 is a lateral cross-sectional view illustrating configuration variations of a holding device in accordance with an embodiment of the present invention. (a) illustrates a configuration in which a second sucking section sucks both a frame part and a first region, and (b) illustrates a configuration in which the second sucking section sucks the first region.

For example, the second sucking section 12 can be configured to suck both the dicing frame 4 and the dicing tape 3 (see (a) of FIG. 7). Alternatively, for example, the second sucking section 12 can be configured to suck only the dicing tape 3 (see (b) of FIG. 7).

As such, the second sucking section 12 is configured to suck at least one of the dicing frame 4 and the first region so that a boundary between the structure 14 and at least one of the dicing frame 4 and the first region is sealed. This allows a part of the first region, which part is inner than a part sealed by the second sucking section 12, to be protected from an external atmosphere of solvent or the like.

Note that, in a case where the second sucking section 12 sucks the first region, it is preferable that the second sucking section 12 sucks an outer edge of the first region. In a case where the second sucking section 12 is thus configured to suck the outer edge of the first region, in particular, a part of the first region which part is adjacent to the dicing frame 4, it is possible to protect a most part of the first region from an external atmosphere of solvent or the like. Note that the outer edge of the first region indicates a part of the first region which part is closer to the dicing frame 4 than to the wafer 2.

As above described, the holding device 10 can include, instead of the second sucking section 12, a mechanism (sealing means) for sealing a boundary between certain members by physical force or magnetic force. In this case, it is sufficient that the sealing means seals a boundary between the structure 14 and at least one of the dicing frame 4 and the dicing tape 3.

In Embodiment 2 and Embodiment 3, the second sucking section 12 is described in the drawings as a member that is configured to suck the dicing frame 4. Note, however, that, as with Embodiment 1, it is sufficient that the second sucking section 12 in Embodiment 2 and Embodiment 3 is configured to suck at least one of the dicing frame 4 and the dicing tape 3.

[Embodiment 2]

Figure 8:
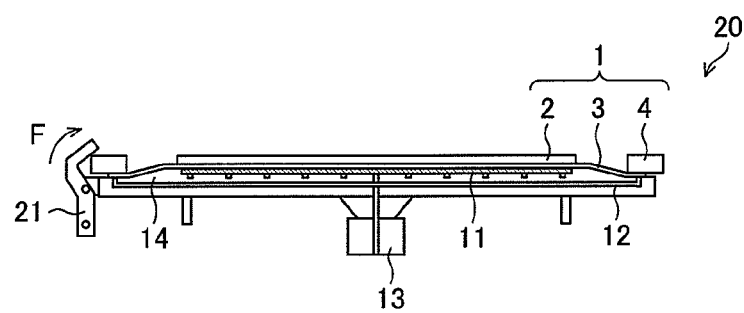
FIG. 8 is a lateral cross-sectional view schematically illustrating a configuration of a holding device in accordance with an embodiment of the present invention.

FIG. 8 is a lateral cross-sectional view schematically illustrating a configuration of a holding device 20 in accordance with an embodiment of the present invention. The following description will discuss only differences from the holding device 10. As illustrated in FIG. 8, the holding device 20 is different from the holding device 10 in that the holding device 20 includes a clamp (force adding means) 21.

The clamp 21 is a member for holding down the dicing frame 4. The boundary between the dicing frame 4 and the structure 14 is sealed by the second sucking section 12 as early described, and, in addition to the second sucking section 12, the clamp 21 adds force to the dicing frame 4. This makes it possible to further suitably cause the dicing frame 4 and the structure 14 to be in close contact with each other so as to seal the boundary between the dicing frame 4 and the structure 14.

The clamp 21 is provided at a location outer than the first sucking section 11. In a case where the wafer 2 is horizontally placed, the clamp 21 is rotated in an F-direction in FIG. 8 so as to add force in a vertically downward direction to the dicing frame 4, which is outer than a part of the dicing tape 3 which part is sucked by the first sucking section 11. Further, the clamp 21 adds force such that a forced part, to which the force is added, is located vertically lower than an inner part which is inner with respect to the forced part. Specifically, the clamp 21 presses the dicing frame 4 until the forced part is located lower than the inner part. In the present invention, the inner part can be at least a part of an area inner than the forced part. However, it is preferable that the dicing frame 4 is pressed so that the forced part is located lower than the entire area lying on the inner side of the forced part. In other words, as an area of a part, which is located higher than the forced part, becomes larger, force of pulling the dicing tape 3 downwards becomes stronger. This makes it possible to reduce influence derived from (i) warpage of the wafer 2 and the dicing frame 4 and (ii) wrinkles of the dicing tape 3.

Note that the clamp 21 includes a spring (elastic body; not illustrated). Force of the spring is added vertically downwards, and therefore force added to the wafer 2 becomes stronger.

Moreover, a part of the dicing frame 4, to which part force is added by the clamp 21, is located lower than the wafer 2.

With the configuration, it is possible to sufficiently pull the dicing tape 3, and this makes it possible to fix the wafer 2 more firmly.

By the function of the clamp 21 above described, the dicing tape 3 is to be pulled from the center to the periphery and in the vertically downward direction. This allows the holding device 20 to securely suck and hold the wafer 2 even in a case where the wafer 2 and the dicing tape 3 are warped and the dicing tape 3 is wrinkled.

In the present embodiment, the case has been described in which the clamp 21 includes the spring (elastic body). Note, however, that the force adding section of the holding device in accordance with the present invention does not necessarily include the elastic body. However, in view of holding down a substrate with stronger force, it is preferable that the force adding section of the holding device in accordance with the present invention includes the elastic body.

In the present embodiment, the case has been described in which the clamp 21 holds down the dicing frame 4 from above. Note, however, that the force adding section of the holding device in accordance with the present invention can have a configuration other than the configuration of holding down the supporting film from above. For example, the force adding section can pull the supporting film from below. As such, the configuration of the force adding section is not limited, provided that the force adding section can add vertically downward force to the supporting film. Alternatively, the force adding section can be configured to hold down the substrate itself as well as the frame part.

[Embodiment 3]

Figure 9:
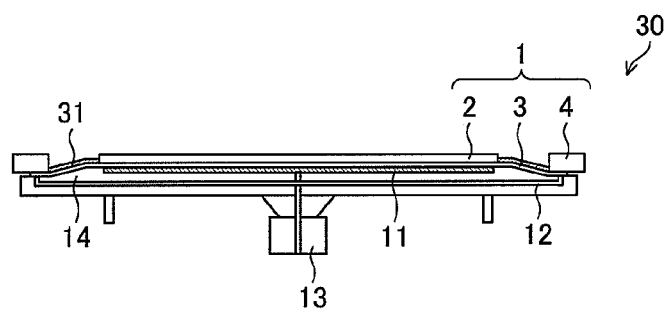
FIG. 9 is a lateral cross-sectional view schematically illustrating a configuration of a holding device in accordance with an embodiment of the present invention.

FIG. 9 is a lateral cross-sectional view schematically illustrating a configuration of a holding device 30 in accordance with an embodiment of the present invention. The following description will discuss only differences from the holding device 10. As illustrated in FIG. 9, the holding device 30 is different from the holding device 10 in that a protective film 31 is formed on the dicing tape 3.

As illustrated in FIG. 9, in the present embodiment, the protective film 31 is formed at least in a second region on the dicing tape 3. The second region (i) is on a surface of the dicing tape 3 to which surface the wafer 2 is adhered and (ii) is between the wafer 2 and the dicing frame 4. A protective film forming section (protective film forming means) 32 (not illustrated) for forming the protective film 31 and a protective film removing section (protective film removing means) 33 (not illustrated) for removing an unnecessary protective film 31 will be described later.

By thus forming the protective film 31 on the dicing tape 3, it is possible to further suitably prevent an atmosphere of solvent from reaching the dicing tape 3. That is, according to the present embodiment, in a part of the dicing tape 3 between the wafer 2 and the dicing frame 4, (i) the lower surface (to which the wafer 2 is not adhered) is shielded from the atmosphere of solvent by the structure 14 and the second sucking section 12 and (ii) the upper surface (to which the wafer 2 is adhered) is shielded from the atmosphere of solvent by the protective film 31. This makes it possible to more suitably inhibit the dicing tape 3 from sagging.

(Protective Film)

A composition of the protective film 31 is not limited to a particular one provided that the protective film 31 is made of a material that is insoluble in the cleaning solution. Note, however, that it is preferable that the protective film 31 is made of a water-soluble material. Such a material of the protective film 31 can be, for example, at least one water-soluble resin selected from the group consisting of acrylic resin, vinyl resin, cellulosic resin, and amide resin.

Examples of acrylic resin encompass a polymer or a copolymer made up of monomers such as acrylic acid, methyl acrylate, methacrylic acid, methyl methacrylate, N,N-dimethylacrylamide, N,N-dimethylaminopropyl methacrylamide, N,N-dimethylaminopropylacryl amide, N-methylacrylamide, diacetoneacrylamide, N,N-dimethylaminoethyl methacrylate, N,N-diethylaminoethyl methacrylate, N,N-dimethylaminoethyl acrylate, and acryloyl morpholine.

Examples of vinyl resin encompass a polymer or a copolymer made up of monomers such as N-vinylpyrrolidone, vinylimidazolidinone, and vinyl acetate.

Examples of cellulosic resin encompass hydroxypropylmethylcellulose phthalate, hydroxypropylmethylcellulose acetate phthalate, hydroxypropylmethylcellulose hexahydrophthalate, hydroxypropylmethylcellulose acetate succinate, hydroxypropylmethylcellulose, hydroxypropylcellulose, hydroxyethylcellulose, cellulose acetate hexahydrophthalate, carboxymethyl cellulose, ethyl cellulose, and methyl cellulose.

Alternatively, water-soluble amide resin can be employed. Among the above resins, vinyl resin is preferable, and polyvinylpyrrolidone or polyvinyl alcohol is particularly preferable.

The water-soluble resins can be used alone or in combination of two or more of these. Among the resins, a resin is employed with which adhesive strength of a dicing tape on which a protective film is formed becomes 50% or lower, more preferably 30% or lower, with respect to that of the dicing tape on which no protective film is formed.

The protective film 31 of the present embodiment can be formed with the use of any of various methods. For example, a method can be employed in which the protective film 31 is formed by applying a liquid of the composition to an exposed surface of the dicing tape 3. Alternatively, it is possible to employ a method in which a protective layer containing the composition is formed on a film such as a flexible film in advance, and then the film is dried and attached to an exposed surface of the dicing frame 4. A method for removing the unnecessary protective film 31 after the processes in the atmosphere of solvent are finished is not limited to a particular one neither. For example, a general method such as a washing or a peeling can be employed.

The forming and the removing of the protective film 31 can be carried out while the process target 1 is being fixed to the structure 14 or while the process target 1 is placed in another place. The following description will discuss an example of an entire configuration of a holding device which includes a protective film forming section 32 and a protective film removing section 33. Note, however, that the present invention is not limited to this. In the description below, the holding device of the present invention is employed as a device for cleaning a substrate. Note, however, that the present invention is not limited to this.

(Cleaning Device)

Figure 10:
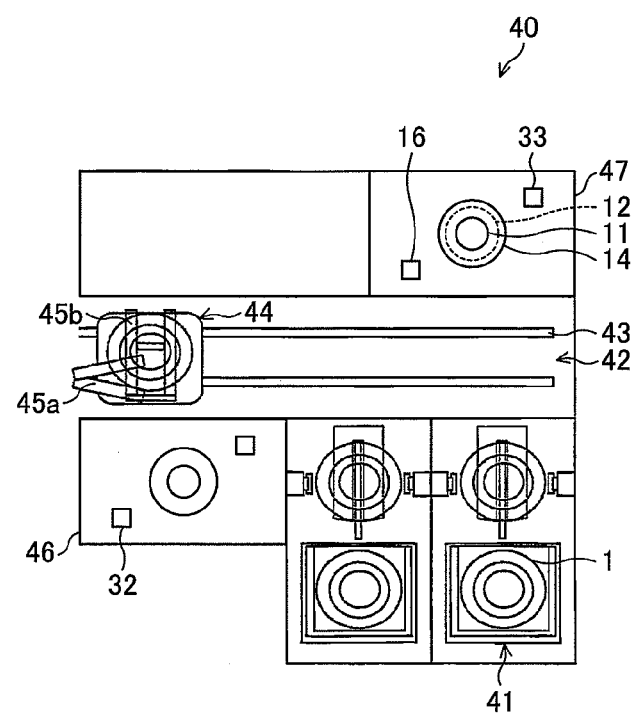
FIG. 10 is a top view schematically illustrating a holding device in accordance with an embodiment of the present invention.

FIG. 10 is a top view illustrating a configuration of a cleaning device (holding device) 40 in accordance with an embodiment of the present invention. As illustrated in FIG. 10, the cleaning device 40 includes (i) a process target containing section 41 for containing a process target 1, (ii) carrying means 42 for carrying the process target 1, (iii) a protective film forming unit 46 for forming a protective film 31 in the process target 1, and (iv) a cleaning unit 47 for cleaning the process target 1. The following description will discuss only differences from the holding device 10.

The carrying means 42 is configured to carry the process target 1 from the process target containing section 41 to the protective film forming unit 46, and further to the cleaning unit 47.

The carrying means 42 has a carrying robot 44 and a running path 43 for achieving straight running. The carrying robot 44 is rotatable about an axis of the carrying robot 44, and has two connected arms 45a and a hand 45b.

The connected arms 45a are configured to expand and contract by a rotational motion at their revolute joint. The hand 45b is provided at an end of one of the connected arms 45a and is configured to hold the process target 1. The carrying robot 44 carries the process target 1 in a horizontal plane by the expansion and contraction of the connected arms 45a and the rotational motion about the axis.

The protective film forming unit 46 includes a protective film forming section 32 for forming the protective film in the process target 1. Specifically, the protective film forming section 32 applies a material composition of the protective film 31 to an exposed surface of the dicing tape 3 which is adhered to the wafer 2.

The protective film forming section 32 is, for example, configured to discharge a liquid material composition from discharging means such as a nozzle. Note, however, that the configuration of the protective film forming section 32 is not limited to the configuration of discharging the liquid material composition. For example, the protective film forming section 32 can be configured to attach a protective film 31 which has been formed in a film in advance.

Alternatively, for example, the protective film forming unit 46 can be configured to irradiate the exposed surface of the dicing tape 3 with an ultraviolet ray before applying the material composition of the protective film 31. This allows an improvement in wettability of the dicing tape 3.

The cleaning unit 47 includes a solvent adding section 16 and a protective film removing section 33, and is configured to clean the process target 1 and to remove the protective film 31. Specifically, the cleaning unit 47 cleans the process target 1 with the use of the solvent adding section 16 and then removes, with the use of the protective film removing section 33, the protective film 31 which has been formed on the dicing tape 3. The cleaning unit 47 further includes a first sucking section 11, a second sucking section 12, and a structure 14. With the configuration, the cleaning unit 47 suitably holds the process target 1, and it is therefore possible to suitably prevent the dicing tape 3 from swelling and sagging due to an atmosphere of solvent when the process target 1 is cleaned or the protective film 31 is removed.

The configuration of the protective film removing section 33 can be changed as appropriate in accordance with a material composition or a form of the protective film 31. For example, the protective film removing section 33 can be configured to discharge a cleaning solution such as water onto the protective film 31 with the use of discharging and supplying means such as a nozzle. Alternatively, the protective film removing section 33 can be configured to peel a film constituting the protective film 31.

For example, the cleaning unit 47 can be configured to dry a surface of the wafer 2 after removing the protective film with the use of the protective film removing section 33. This makes it possible to make the surface of the wafer 2 cleaner. Example of such a process encompasses a plasma processing in which a residual adhesive agent on the surface of the wafer 2 is removed by oxygen plasma.

Note that the protective film forming unit 46 can be configured to rotate the process target 1 while the protective film forming section 32 applies the material composition of the protective film 31. Similarly, the cleaning unit 47 can be configured to rotate, by the rotating section 13 for example, the process target 1 while the process target 1 is cleaned and the protective film 31 is removed.

(Cleaning Method)

Figure 11:
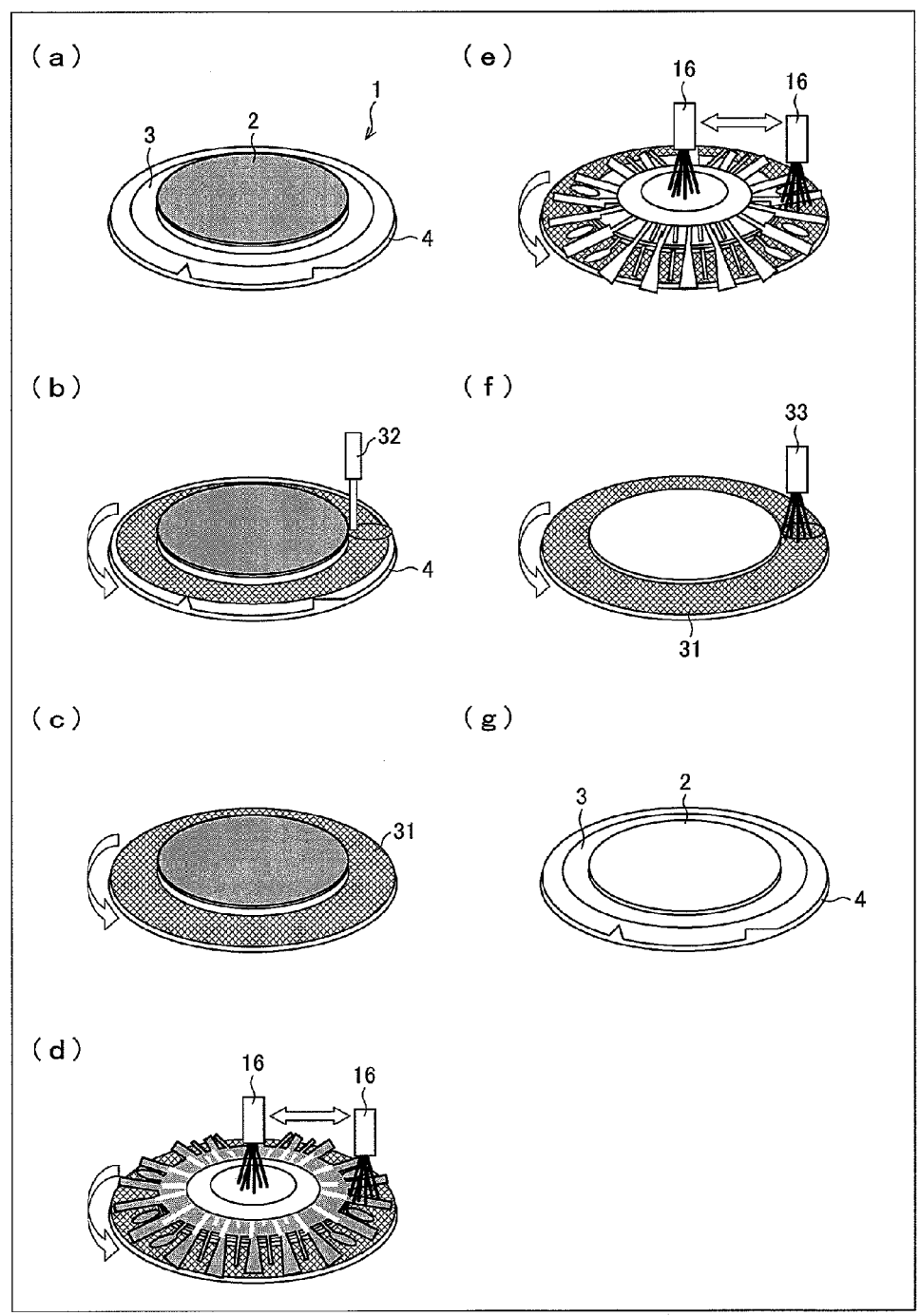
FIG. 11 is a view for schematically explaining a method for processing a process target in accordance with an embodiment of the present invention.
Figure 12:
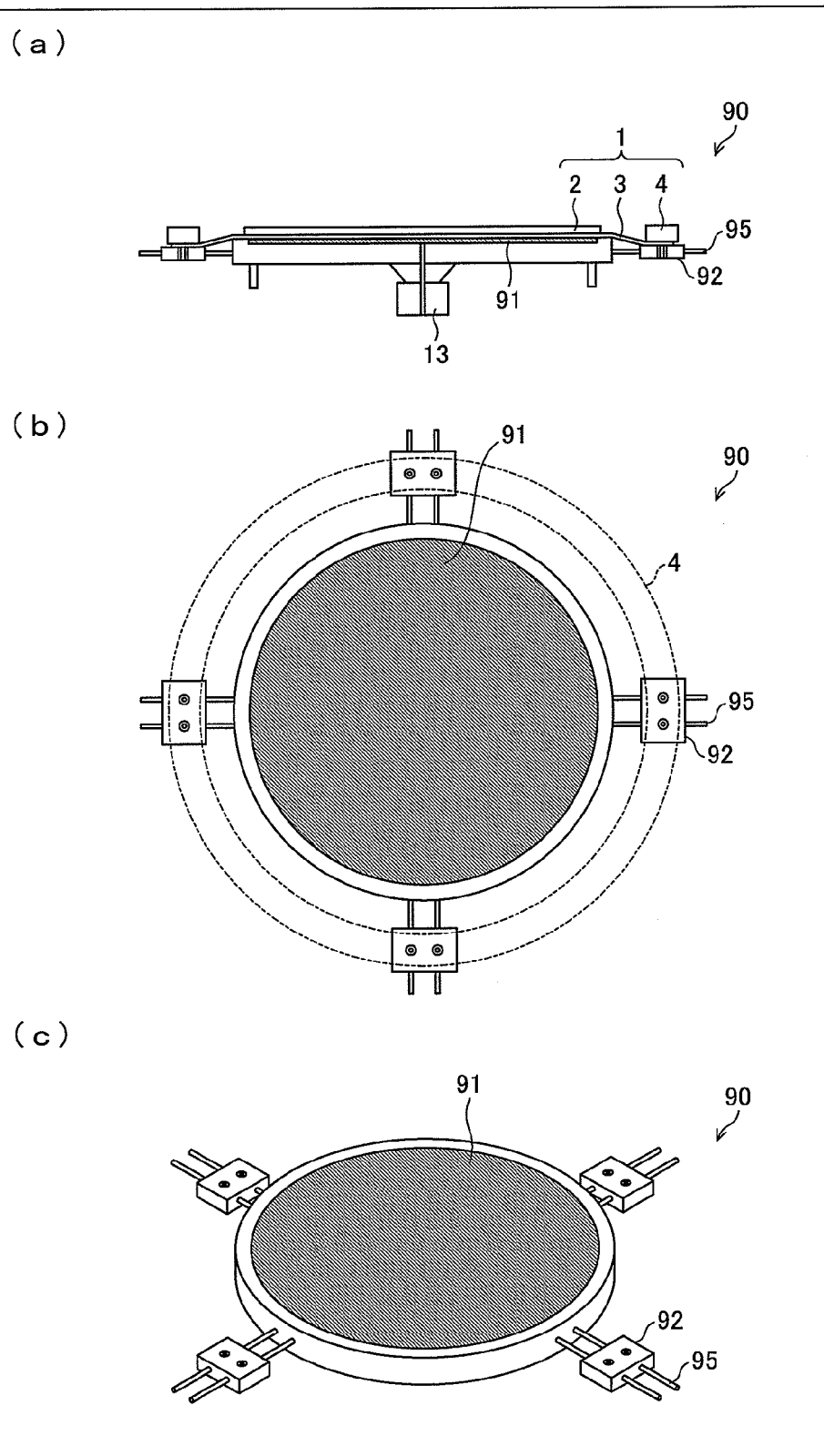
FIG. 12 is a view schematically illustrating a configuration of a conventional holding device. (a) is a lateral cross-sectional view of the holding device, (b) is a top view of the holding device, and (c) is a perspective view of the holding device.

The following description will discuss how the cleaning device 40 operates, with reference to FIG. 11. The cleaning device 40 can carry out a process on a process target 1, (i) which includes the wafer 2 to which the dicing tape 3 is adhered and (ii) in which a supporting plate has been removed. In such a case, an attached substance such as a residual adhesive agent and an undissolved residue is attached to the surface of the wafer 2, and it is preferable that the surface of the wafer 2 is cleaned. The process target 1 is first contained in the process target containing section 41 (see (a) of FIG. 11).

When the process target 1 is carried to the protective film forming unit 46 by the carrying means 42, first, the protective film forming section 32 supplies a material composition of a protective film to an exposed surface of the dicing tape 3 (see (b) of FIG. 11). The method for supplying the material composition is not limited to a particular one, and, for example, the material composition can be discharged from a nozzle-shaped protective film forming section 32 (see (b) of FIG. 11).

Note that it does not matter whether or not the material composition reaches the dicing frame 4, provided that the exposed surface of the dicing tape 3 is at least covered. Alternatively, before supplying the material composition, for example, the surface of the wafer 2 can be masked in advance. This makes it possible to prevent a case where (i) a protective film is formed on the surface of the wafer 2, which is to be cleaned, and therefore (ii) a sufficient cleaning cannot be carried out.

While the material composition is being supplied, the process target 1 can be rotated. This allows the discharged material composition to efficiently spread over the dicing tape 3. Alternatively, the dicing tape can be irradiated with an ultraviolet ray before the material composition is supplied to the dicing tape 3. This makes it possible to improve wettability of the material composition with respect to the dicing tape.

Subsequently, as illustrated in (c) of FIG. 11, the discharged material composition is dried so as to form a protective film 31 (protective film forming step). The drying can be a natural drying. Note, however, that, for example, the process target can be dried while being rotated in a direction indicated by an arrow in (c) of FIG. 11. Note that the drying method is not limited to this. For example, the drying can be carried out (i) with the use of a device such as an oven or a hot plate or (ii) with hot air.

Next, with the use of the carrying means 42, the process target 1 is carried to the cleaning unit 47, and then the wafer 2 is cleaned with a solvent (cleaning step). The cleaning can be carried out with, for example, the method as described in Embodiment 1 (see (d) and (e) of FIG. 11). In this case, before the cleaning, the wafer 2 is sucked by the first sucking section 11 (substrate sucking step), a first region, which is on a lower surface of the dicing tape 3 and is between the wafer 2 and the dicing frame 4, is covered with the structure 14 (covering step), and a boundary between the structure 14 and the dicing frame 4 is sealed by the second sucking section 12 (sealing step), as with Embodiment 1. This makes it possible to prevent the dicing tape 3 from swelling by an atmosphere of solvent in the cleaning.

After the wafer 2 is cleaned, the protective film 31 formed on the dicing tape 3 is removed (see (f) of FIG. 11). The method for removing the protective film 31 is not limited to a particular one. For example, in a case where the protective film 31 is made of a water-soluble material, the protective film 31 can be dissolved and removed by discharging water to the protective film 31 from a liquid discharging section which is the protective film removing means 33 having a nozzle shape. Subsequently, the process target is dried (see (g) of FIG. 11). During the drying, the process target 1 can be rotated. The protective film removing means 33 can alternatively be a member such as a clawed arm that physically removes the protective film 31 in the form of a film.

As such, it is possible to suitably inhibit the sagging of the dicing tape 3 by, before cleaning the wafer 2, carrying out the substrate sucking step, the covering step, and the sealing step with the use of the first sucking section 11, the second sucking section 12, and the structure 14 so that (i) the exposed lower surface of the dicing tape 3 is shielded from the atmosphere of solvent and (ii) the exposed upper surface of the dicing tape 3 is protected by the protective film 31. Moreover, the protective film 31 prevents an undissolved residue or the like, which has been flowed from the wafer 2, from attaching to the dicing tape 3. This makes it possible to prevent the undissolved residue or the like from attaching to the wafer 2 again when the dicing process is carried out later.

Note that, after the wafer 2 is cleaned with the above described method, the adhesive agent and the like may be left at an edge part of the wafer 2. Even in such a case, amounts of the residual adhesive agent and the like are not so large as to interfere with the subsequent processes. If necessary, however, it is possible to provide a step of removing the residual adhesive agent which remains at the edge part of the wafer 2. Specifically, for example, before drying the process target 1, (i) the edge part of the wafer 2 can be cleaned with a cleaning solution while supplying water to the exposed surface of the dicing tape 3 or (ii) the residual adhesive agent can be removed with a blade or a brush.

The present invention is not limited to the aforementioned embodiments and is susceptible of various changes within the scope of the accompanying claims. That is, embodiments obtained by suitable combinations of technical means modified within the scope of the accompanying claims are also included within the technical scope of the present invention.

[Example]

With the use of a holding device (Example) of the present invention and a conventional holding device (Comparative Example), spin cleaning was carried out and changes in sagging amount of the dicing tapes with time were measured.

In Example, a process target 1 was held by the holding device including (i) a structure 14 that covers a first region which (i) is on a lower surface of a dicing tape 3 and (ii) is between a wafer 2 and a dicing frame 4 and (ii) a second sucking section 12 for sealing a boundary between the structure 14 and the dicing frame 4 as illustrated in FIG. 6, and spin cleaning was carried out for a predetermined time period. In Comparative Example, a process target 1 was held by the conventional holding device which does not include such a structure 14 and a second sucking section 12, and spin cleaning was carried out for a predetermined time period.

Figure 4:
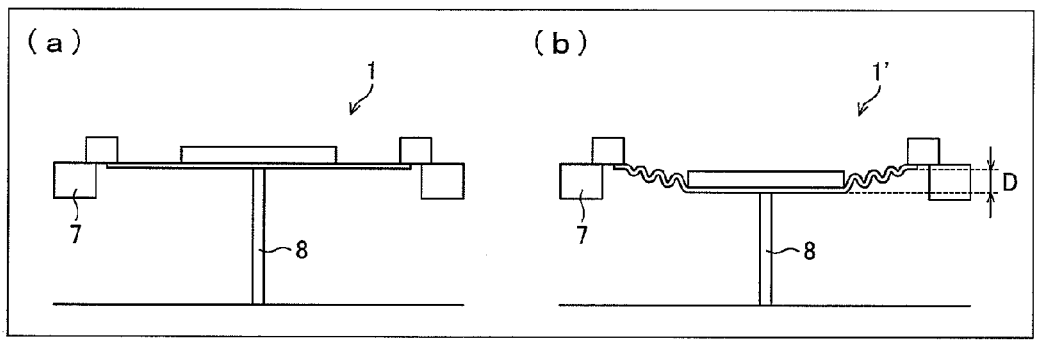
FIG. 4 is a schematic view for explaining a method for measuring a sagging amount of a supporting film in a process target. (a) illustrates a case where a process target is measured in which a supporting film is not sagging, and (b) illustrates a case where the process target is measured in which the supporting film is sagging.

The sagging amounts of the dicing tapes were measured with the use of an apparatus as illustrated in FIG. 4. As a preparation, an alignment block 7 was placed which corresponds to a size of the dicing frame 4 of the process target 1 to be measured. Before starting the spin cleaning, the process target 1 is placed on the alignment block 7 as illustrated in (a) of FIG. 4, and a location of a lower surface of the wafer 2 was measured with the use of a micrometer 8 so as to obtain an initial value. Then, after the spin cleaning, the process target 1 removed from the holding device was similarly placed on the alignment block 7 as illustrated in (b) of FIG. 4, and a location of the lower surface of the wafer 2 was measured with the use of the micrometer 8. Then, a difference from the initial value was calculated so as to obtain a sagging amount D. Note that, when the process target 1 was placed on the alignment block 7, an alignment line of the alignment block 7 and the like were used so that the dicing frame 4 is placed in an identical location each time.

Figure 5:
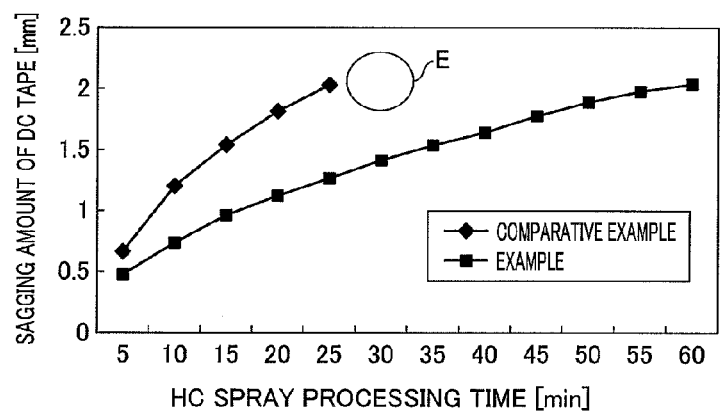
FIG. 5 is a graph for comparing Example of the present invention with Comparative Example as to change in sagging amount of a supporting film in a process target in an atmosphere of solvent.

As the wafer 2, bare glass of 12 inches was employed. As the dicing tape 3, a commercially available dicing tape (UC-353EP) was employed. In the spin cleaning, 30 mL/min of HC thinner (hydrocarbon thinner) was discharged together with 50 L/min of air onto the wafer 2 with the use of a spray unit (two fluid spray). A rotating speed of the process target 1 in the spin cleaning was 2000 rounds/min, and the measurements were carried out in a range between 5 minutes and 60 minutes. FIG. 5 illustrates the results.

As illustrated in FIG. 5, the sagging amount of the dicing (DC) tape 3 of Example was inhibited, as compared with Comparative Example. In FIG. 5, a circle indicated by "E" shows that the sagging amount of the dicing tape 3 in Comparative Example became too large, and therefore a suction error was caused in the sucking section. As such, according to the present invention, the sagging of the dicing tape due to the atmosphere of solvent was inhibited, and the problem caused by the sag of the dicing tape was successfully avoided.

INDUSTRIAL APPLICABILITY

The present invention can be used in, for example, processing a surface of a thin plate wafer.

REFERENCE SIGNS LIST 1, 1': Process target
2: Wafer (substrate)
3, 3': Dicing tape (supporting film)
4: Dicing frame (frame part)
5: Porous stage
6: Carrying robot arm
7: Alignment block
8: Micrometer
10, 10', 10", 20, 30: Holding device
40: Cleaning device (holding device)
11: First sucking section (first sucking means)
12, 12', 12": Second sucking section (sealing means, second sucking means)
13: Rotating section (rotating means)
14: Structure
16: Solvent adding section (solvent adding means)
21: Clamp (force adding section)
31: Protective film
32: Protective film forming section (protective film forming means)
33: Protective film removing section

What is claimed is:

1. A holding device for holding a substrate which is adhered to a center part of a supporting film having a frame part at an outer edge of the supporting film, said holding device comprising:
   a first vacuum source for sucking the substrate from a side on which the supporting film is adhered;
   a structure that supports the frame part and covers a first region which (i) is on a surface of the supporting film to which surface the substrate is not adhered and (ii) is between the substrate and the frame part; and a seal for sealing at least one of the boundaries (i) between the structure and the frame part and (ii) between the structure and the first region, wherein when the substrate is horizontally placed, the structure supports the frame part such that the frame part is located lower than the substrate.

2. The holding device as set forth in claim 1, further comprising a source of solvent for adding a solvent to a surface of the substrate to which surface the supporting film is not adhered.

3. The holding device as set forth in claim 2, further comprising:

a rotor for rotating the substrate in an in-plane direction of a surface of the substrate while the substrate is being sucked by the first vacuum source, wherein said holding device serves as a cleaning device for cleaning the substrate.

4. The holding device as set forth in claim 1, wherein:

the seal includes a second vacuum source for sucking at least one of the frame part and the first region; and wherein the second vacuum source is provided on the structure.

5. The holding device as set forth in claim 1, wherein a surface of the structure facing the first region includes a surface that inclines downwards with respect to a surface of the substrate.

6. The holding device as set forth in claim 1, further comprising a clamp for adding force in a vertically downward direction to the frame part when the substrate is horizontally placed.

7. A holding device for holding a substrate which is adhered to a center part of a supporting film having a frame part at an outer edge of the supporting film, said holding device comprising:

a first vacuum source for sucking the substrate from a side on which the supporting film is adhered;

a structure that supports the frame part and covers a first region which (i) is on a surface of the supporting film to which surface the substrate is not adhered and (ii) is between the substrate and the frame part;

a seal for sealing at least one of the boundaries (i) between the structure and the frame part and (ii) between the structure and the first region; and a source of a material composition for forming a protective film in a second region which (i) is on a surface of the supporting film to which surface the substrate is adhered and (ii) is between the substrate and the frame part.

8. A method for holding a substrate which is adhered to a center part of a supporting film having a frame part at an outer edge of the supporting film, said method comprising:

sucking the substrate from a side on which the supporting film is adhered;

covering, with a structure, a first region which (i) is on a surface of the supporting film to which surface the substrate is not adhered and (ii) is between the substrate and the frame part; and sealing at least one of the boundaries (i) between the structure and the frame part and (ii) between the structure and the first region, wherein when the substrate is horizontally placed, the structure supports the frame part such that the frame part is located lower than the substrate.

9. The holding device as set forth in claim 1, wherein the seal seals the boundary between the structure and the first region.

10. The holding device as set forth in claim 9, wherein:

the seal includes a second vacuum source for sucking the first region; and the second vacuum source is provided on the structure.

11. The holding device as set forth in claim 1, wherein the seal seals the boundary between the structure and the frame part.

12. The holding device as set forth in claim 9, wherein:

the seal includes a second vacuum source for sucking the frame part; and the second vacuum source is provided on the structure.

13. The holding device as set forth in claim 1, wherein the seal seals the boundaries (i) between the structure and the frame part and (ii) between the structure and the first region.

14. The holding device as set forth in claim 9, wherein:

the seal includes a second vacuum source for sucking the frame part and the first region; and the second vacuum source is provided on the structure.

15. The holding device as set forth in claim 1, further comprising:

a source of solvent for adding a solvent to a surface of the substrate to which surface the supporting film is not adhered; and a rotor for rotating the substrate in an in-plane direction of a substrate surface of the substrate while the substrate is being sucked by the first vacuum source, said holding device serving as a cleaning device for cleaning the substrate, wherein:

the seal includes a second vacuum source for sucking at least one of the frame part and the first region;

the second vacuum source is provided on the structure; and a surface of the structure, which surface faces the first region, includes a surface that inclines downwards with respect to a substrate surface of the substrate.

16. The holding device as set forth in claim 15, further comprising a clamp for adding force in a vertically downward direction to the frame part when the substrate is horizontally placed.

17. A holding device as set forth in claim 16, further comprising a source of a material composition for forming a protective film in a second region which (i) is on a surface of the supporting film to which surface the substrate is adhered and (ii) is between the substrate and the frame part.

* * * * *